(12) United States Patent
Weispfennig et al.

(10) Patent No.: US 9,706,638 B2
(45) Date of Patent: Jul. 11, 2017

(54) ASSEMBLIES AND METHODS FOR DIRECTLY CONNECTING INTEGRATED CIRCUITS TO ELECTRICALLY CONDUCTIVE SHEETS

(71) Applicant: Astec International Limited, Kowloon (HK)

(72) Inventors: Daryl Weispfennig, Chanhassen, MN (US); Bradley Schumacher, Savage, MN (US); Kwong Kei Chin, Fremont, CA (US)

(73) Assignee: ASTEC INTERNATIONAL LIMITED, Kwun Tong, Kowloon (HK)

( * ) Notice: Subject to any disclaimer, the term of this patent is extended or adjusted under 35 U.S.C. 154(b) by 14 days.

(21) Appl. No.: 14/996,623

(22) Filed: Jan. 15, 2016

(65) Prior Publication Data

US 2016/0135281 A1 May 12, 2016

Related U.S. Application Data

(62) Division of application No. 12/568,941, filed on Sep. 29, 2009, now abandoned.

(51) Int. Cl.
*H05K 7/20* (2006.01)
*H05K 1/02* (2006.01)
(Continued)

(52) U.S. Cl.
CPC ..... *H05K 1/0203* (2013.01); *H01L 23/49537* (2013.01); *H01L 23/49541* (2013.01);
(Continued)

(58) Field of Classification Search
CPC . H05K 1/02; H05K 3/34; H01L 21/02; H01L 21/60; H01L 23/06; H01L 23/08;
(Continued)

(56) References Cited

U.S. PATENT DOCUMENTS

| 3,760,384 A | 9/1973 | Krolikowski et al. |
| 4,809,135 A | 2/1989 | Yerman |

(Continued)

FOREIGN PATENT DOCUMENTS

| JP | 2-229512 | 9/1990 |
| JP | 5-206596 | 8/1993 |
| KR | 10-0704919 | 4/2007 |

*Primary Examiner* — Xiaoliang Chen
(74) *Attorney, Agent, or Firm* — Harness, Dickey & Pierce, P.L.C.

(57) ABSTRACT

An integrated circuit assembly includes a first electrically conductive sheet, a second electrically conductive sheet electrically isolated from the first electrically conductive sheet, a non-conductive material disposed between the first and second electrically conductive sheets, an electrical trace disposed on the non-conductive material and electrically isolated from the first and second electrically conductive sheets, and an integrated circuit having at least one lead directly connected to the first electrically conductive sheet, at least one lead directly connected to the second electrically conductive sheet, and at least one lead electrically connected to the electrical trace. Other integrated circuit assemblies and method for making integrated circuit assemblies are also disclosed.

9 Claims, 2 Drawing Sheets

(51) Int. Cl.
  *H05K 1/11* (2006.01)
  *H05K 1/18* (2006.01)
  *H05K 1/03* (2006.01)
  *H05K 1/09* (2006.01)
  *H01L 23/495* (2006.01)

(52) U.S. Cl.
  CPC .. *H01L 23/49568* (2013.01); *H01L 23/49582* (2013.01); *H05K 1/0298* (2013.01); *H05K 1/0313* (2013.01); *H05K 1/09* (2013.01); *H05K 1/115* (2013.01); *H05K 1/181* (2013.01)

(58) Field of Classification Search
  CPC ......... H01L 23/24; H01L 23/28; H01L 23/31; H01L 23/34; H01L 23/48; H01L 23/045
  USPC ................ 361/719, 715, 761; 174/260–262; 257/666, 678, 693, 685, 706, 727, 735, 257/771
  See application file for complete search history.

(56) References Cited

U.S. PATENT DOCUMENTS

| | | |
|---|---|---|
| 5,132,878 A | 7/1992 | Carey |
| 5,165,166 A | 11/1992 | Carey |
| 5,438,166 A | 8/1995 | Carey et al. |
| 5,475,264 A | 12/1995 | Sudo et al. |
| 5,569,957 A | 10/1996 | McLean |
| 5,631,809 A | 5/1997 | Takagi et al. |
| 5,665,651 A | 9/1997 | Asada et al. |
| 5,672,848 A | 9/1997 | Komorita et al. |
| 5,986,334 A | 11/1999 | Lee |
| 6,249,964 B1 | 6/2001 | Ozaki |
| 6,353,540 B1 | 3/2002 | Akiba et al. |
| 6,521,845 B1* | 2/2003 | Barrow ................ H05K 1/0207 174/260 |
| 7,038,310 B1 | 5/2006 | Nakatani et al. |
| 7,109,577 B2 | 9/2006 | Shiraishi et al. |
| 7,203,071 B2 | 4/2007 | Nakagawa |
| 7,408,251 B2 | 8/2008 | Hata et al. |
| 7,436,672 B2 | 10/2008 | Ushijima et al. |
| 7,682,935 B2 | 3/2010 | Burke et al. |
| 2001/0019856 A1 | 9/2001 | Takahashi et al. |
| 2001/0035570 A1 | 11/2001 | Iijima et al. |
| 2001/0045635 A1* | 11/2001 | Kinzer ................ H01L 23/3114 257/685 |
| 2001/0048154 A1 | 12/2001 | Cheah et al. |
| 2002/0008319 A1 | 1/2002 | Davis et al. |
| 2002/0015293 A1 | 2/2002 | Akiba et al. |
| 2002/0047198 A1* | 4/2002 | Sammon ........... H01L 23/49503 257/735 |
| 2003/0003629 A1 | 1/2003 | Koike et al. |
| 2003/0025172 A1 | 2/2003 | Grube et al. |
| 2003/0052405 A1* | 3/2003 | Moriguchi .......... H01L 23/3107 257/706 |
| 2003/0075785 A1 | 4/2003 | Crowley et al. |
| 2003/0075796 A1 | 4/2003 | Hata et al. |
| 2003/0132531 A1 | 7/2003 | Standing et al. |
| 2003/0151137 A1 | 8/2003 | Asano et al. |
| 2003/0153128 A1 | 8/2003 | Ito |
| 2003/0155645 A1 | 8/2003 | Ito |
| 2003/0173640 A1 | 9/2003 | Ando et al. |
| 2003/0177635 A1 | 9/2003 | Arrington et al. |
| 2004/0021233 A1* | 2/2004 | Kinzer ................ H01L 23/3114 257/778 |
| 2004/0227431 A1 | 11/2004 | Mishima |
| 2004/0262720 A1 | 12/2004 | Satou et al. |
| 2005/0116322 A1 | 6/2005 | Sando et al. |
| 2005/0121777 A1 | 6/2005 | Hata et al. |
| 2005/0133818 A1 | 6/2005 | Johnson et al. |
| 2005/0146339 A1 | 7/2005 | Grube et al. |
| 2005/0161785 A1 | 7/2005 | Kawashima et al. |
| 2005/0199987 A1 | 9/2005 | Danno et al. |
| 2005/0206010 A1 | 9/2005 | Noquil et al. |
| 2005/0269684 A1 | 12/2005 | Baek et al. |
| 2006/0055015 A1* | 3/2006 | Zhaung ................ H01L 23/045 257/678 |
| 2006/0055432 A1 | 3/2006 | Shimokawa et al. |
| 2006/0169976 A1 | 8/2006 | Kameda et al. |
| 2006/0175700 A1 | 8/2006 | Kagii et al. |
| 2006/0197196 A1 | 9/2006 | Kajiwara et al. |
| 2006/0197200 A1 | 9/2006 | Kajiwara et al. |
| 2006/0249750 A1 | 11/2006 | Johnson et al. |
| 2006/0263988 A1 | 11/2006 | Takahashi et al. |
| 2007/0001297 A1 | 1/2007 | Higasa et al. |
| 2007/0029540 A1 | 2/2007 | Kajiwara et al. |
| 2007/0072347 A1 | 3/2007 | Noquil et al. |
| 2007/0090523 A1* | 4/2007 | Otremba ................ H01L 23/492 257/727 |
| 2007/0108600 A1 | 5/2007 | Hata et al. |
| 2007/0143995 A1 | 6/2007 | Tourne et al. |
| 2007/0158819 A1 | 7/2007 | Hirashima et al. |
| 2007/0200537 A1 | 8/2007 | Akiyama et al. |
| 2007/0210430 A1 | 9/2007 | Kagii et al. |
| 2007/0247176 A1 | 10/2007 | Grube et al. |
| 2007/0257376 A1 | 11/2007 | Shimokawa et al. |
| 2008/0048322 A1 | 2/2008 | Baek et al. |
| 2008/0142985 A1 | 6/2008 | Fan |
| 2008/0150105 A1 | 6/2008 | Hosseini et al. |
| 2008/0169537 A1* | 7/2008 | Kajiwara .............. H01L 23/495 257/666 |
| 2008/0211010 A1 | 9/2008 | Hata et al. |
| 2008/0230889 A1* | 9/2008 | Standing ................ H01L 23/492 257/693 |
| 2008/0237856 A1 | 10/2008 | Hisada et al. |
| 2008/0251912 A1 | 10/2008 | Otremba et al. |
| 2008/0268577 A1 | 10/2008 | Kagii et al. |
| 2008/0272794 A1 | 11/2008 | Grube et al. |
| 2008/0278873 A1 | 11/2008 | Leduc et al. |
| 2009/0001554 A1 | 1/2009 | Otremba |
| 2009/0194880 A1* | 8/2009 | Feng ...................... H01L 24/03 257/771 |
| 2009/0253278 A1 | 10/2009 | Chen |
| 2009/0294936 A1 | 12/2009 | Liu et al. |

* cited by examiner

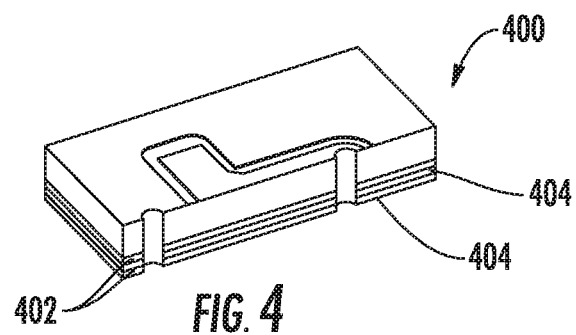
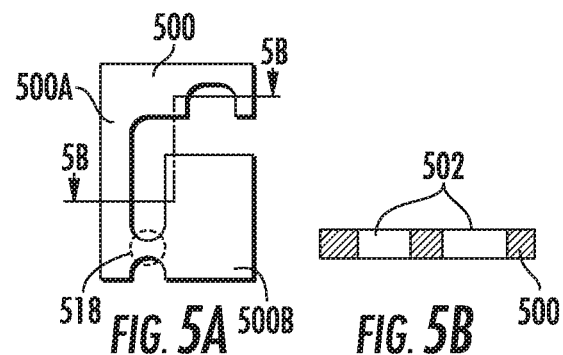
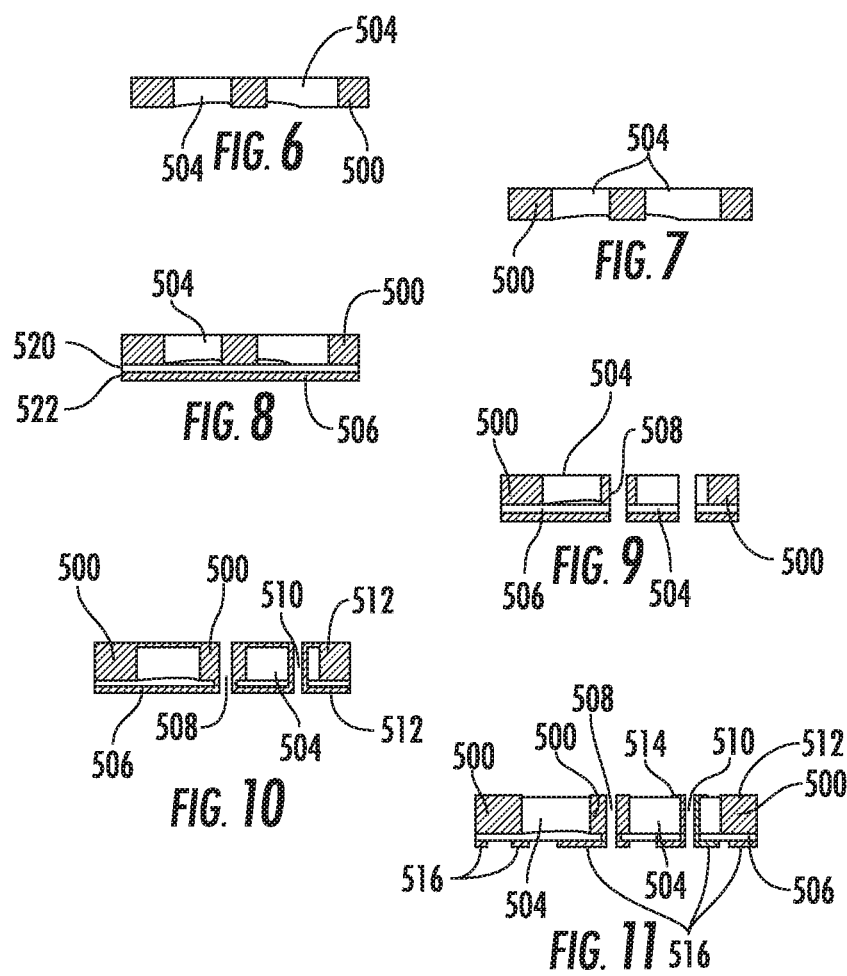

ASSEMBLIES AND METHODS FOR DIRECTLY CONNECTING INTEGRATED CIRCUITS TO ELECTRICALLY CONDUCTIVE SHEETS

CROSS-REFERENCE TO RELATED APPLICATION

This application is a divisional of U.S. patent application Ser. No. 12/568,941 filed Sep. 29, 2009. The entire disclosure of the above application is incorporated herein by reference.

FIELD

The present disclosure relates to integrated circuit assemblies and methods for directly connecting integrated circuits to electrically conductive sheets.

BACKGROUND

This section provides background information related to the present disclosure which is not necessarily prior art.

Integrated circuits are commonly mounted to circuit boards by inserting leads (sometimes referred to as pins) of the integrated circuit into holes in the board and soldering the leads to the board. For surface mount integrated circuits having a fine lead pitch, the leads are typically soldered to conductive pads on the circuit board. In either case, the leads of an integrated circuit are typically connected to other component leads on the board by conductive traces and vias on the outer and/or inner layer(s) of the board.

SUMMARY

This section provides a general summary of the disclosure, and is not a comprehensive disclosure of its full scope or all of its features.

According to one aspect of the present disclosure, an integrated circuit assembly includes a first electrically conductive sheet, a second electrically conductive sheet electrically isolated from the first electrically conductive sheet, a non-conductive material disposed between the first and second electrically conductive sheets, an electrical trace disposed on the non-conductive material and electrically isolated from the first and second electrically conductive sheets, and an integrated circuit having at least one lead directly connected to the first electrically conductive sheet, at least one lead directly connected to the second electrically conductive sheet, and at least one lead electrically connected to the electrical trace.

According to another aspect of the present disclosure, an integrated circuit assembly includes a first electrically conductive sheet, a second electrically conductive sheet electrically isolated from the first electrically conductive sheet, a non-conductive material disposed between the first and second electrically conductive sheets, a conductive via formed in at least the non-conductive material and electrically isolated from the first and second electrically conductive sheets, an integrated circuit positioned on a first side of the electrically conductive sheets and having at least one lead directly connected to the first electrically conductive sheet, at least one lead directly connected to the second electrically conductive sheet, and at least one lead electrically connected to the conductive via, a circuit board positioned on a second side of the electrically conductive sheets, and at least one control circuit disposed on the circuit board and electrically connected to the conductive via for providing a control signal to the integrated circuit.

According to yet another aspect of the present disclosure, a method of making an integrated circuit assembly includes disposing a non-conductive material in an opening between first and second electrically conductive sheets, plating at least a portion of a first side of the non-conductive material, removing at least a portion of the plating from the non-conductive material to form an electrical trace disposed on the non-conductive material and electrically isolated from the first and second electrically conductive sheets, and soldering at least one lead of an integrated circuit directly to each of the first and second electrically conductive sheets and at least one lead of the integrated circuit to the electrical trace.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 4 is a sectional perspective view of a portion of an integrated circuit assembly having a multi-layer circuit board according to another example embodiment.

FIGS. 5A and 5B are top and sectional views of an electrically conductive sheet according to another example of the present disclosure.

FIG. 6 is a sectional view of the electrically conductive sheet of FIG. 5 after an opening is filled with a non-conductive material.

FIG. 7 is a sectional view of the electrically conductive sheet of FIG. 6 after removal of excess non-conductive material;

FIG. 8 is a sectional view of a circuit board coupled to the electrically conductive sheet of FIG. 7;

FIG. 9 is a sectional view of the assembly of FIG. 8 with holes formed through the circuit board, the electrically conductive sheet, and the non-conductive material.

FIG. 10 is a sectional view of the assembly of FIG. 9 after the assembly is plated with an electrically conductive material.

FIG. 11 is a sectional view of the assembly of FIG. 10 after removal of a portion of the plating.

DETAILED DESCRIPTION

Figure 1:
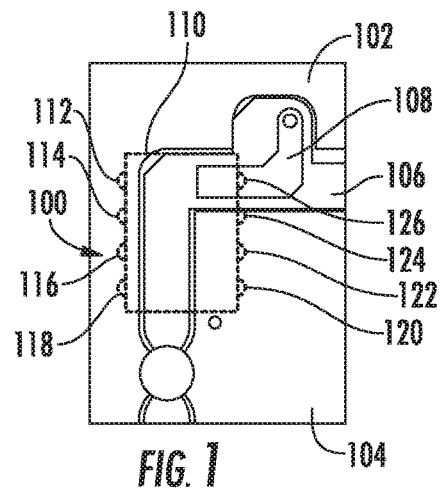
FIG. 1 is a plan view of an integrated circuit assembly according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known methods, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, methods, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "top", "bottom", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

According to one aspect of the present disclosure, a circuit assembly includes a first electrically conductive sheet, a second electrically conductive sheet electrically isolated from the first electrically conductive sheet, a non-conductive material disposed between the first and second electrically conductive sheets, an electrical trace disposed on the non-conductive material and electrically isolated from the first and second electrically conductive sheets, and an integrated circuit having at least one lead directly connected to the first electrically conductive sheet, at least one lead directly connected to the second electrically conductive sheet, and at least one lead electrically connected to the electrical trace.

Direct connection of the integrated circuit leads to the electrically conductive sheets can minimize resistance in the current paths to and from the integrated circuit leads. Additionally, the electrically conductive sheets may dissipate heat generated by current flowing therethrough.

FIG. 1 illustrates one example embodiment of an integrated circuit assembly 100 incorporating this aspect of the present disclosure. The circuit assembly 100 includes electrically conductive sheets 102,104 and non-conductive material 106 disposed between the electrically conductive sheets 102, 104. The circuit assembly 100 further includes an electrical trace 108 disposed on the non-conductive material 106. The electrical trace 108 is electrically isolated from each of the electrically conductive sheets 102, 104. The circuit assembly 100 also includes an integrated circuit 110 (shown in phantom, for illustrative purposes) having multiple leads 112-126. Four leads 112, 114, 116, 118 of the integrated circuit 110 are directly connected to the electrically conductive sheet 102, and three leads 120, 122, 124 of the integrated circuit 110 are directly connected to the electrically conductive sheet 104. The other lead 126 is electrically connected to the electrical trace 108.

The integrated circuit 110 may include power transistors such as FETs, BJTs, IGBTs, etc. In some embodiments, the integrated circuit 110 is a MOSFET having a SO-8 fine pitch surface mount package. In that event, the leads 112-118 directly connected to the electrically conductive sheet 102 are drain leads, and the leads 120-124 directly connected to the electrically conductive sheet 104 are source leads. When voltage is applied to the other lead 126, i.e., the gate, current flows between the drain and source leads 112-124 and between the electrically conductive sheets 102, 104. Alternatively, other types of integrated circuits may be employed in the assembly of FIG. 1, including those having a different number of leads and/or a different lead pitch than what is shown in FIG. 1.

The non-conductive material 106 may include a dielectric resin, such as an epoxy resin, etc. The epoxy resin may have a high glass transition temperature (Tg), e.g., about 160° C., and a low coefficient of thermal expansion (CTE), e.g., about 32 ppm/C below glass transition temperature and about 112 ppm/C above glass transition temperature. Further, the epoxy resin may be platable to permit the electrical trace 108 to be formed directly on the non-conductive material through a plating process. Alternatively, other suitable non-conductive materials and constructions may be employed.

Referring again to FIG. 1, the electrically conductive sheets 102, 104 each include a copper core plated with an electrically conductive material, e.g., copper, etc. Alternatively, other electrically conductive materials, such as brass, nickel, tin, aluminum, silver, gold, etc., may be used for the cores and/or plating of the electrically conductive sheets, and the electrically conductive sheets may be formed in other ways. Further, in some embodiments, the electrically conductive sheets are not plated.

The electrically conductive sheets 102, 104 each have a thickness of about 1 millimeter. In this particular embodiment, the about 1 millimeter thicknesses permit each lead of the integrated circuit 110 directly connected to one of the electrically conductive sheets 102, 104 to conduct up to about 10 amps, without a significant increase in temperature. The thickness, surface area and/or volume of the electrically conductive sheets may be selected based on the expected current flow or other considerations. In various embodiments, the electrically conductive sheets have thicknesses of about 0.5 millimeters, about 1.5 millimeters, about 2 millimeters, about 2.5 millimeters, and about 5 millimeters. It should be understood, however, that other thicknesses can and will be used in other embodiments.

As shown in FIG. 1, lead 126 of the integrated circuit 110 is connected to the electrical trace 108. Current flow through the integrated circuit 110 may depend on a control signal applied to the lead 126 by a control circuit. The control circuit may be disposed on the same or different side of the circuit assembly 100 as the integrated circuit 110, and electrically connected to the trace 108. Alternatively, the control circuit may be located on a different assembly, with the control signal supplied to the circuit assembly 100 through, e.g., a connector.

Figure 2A:
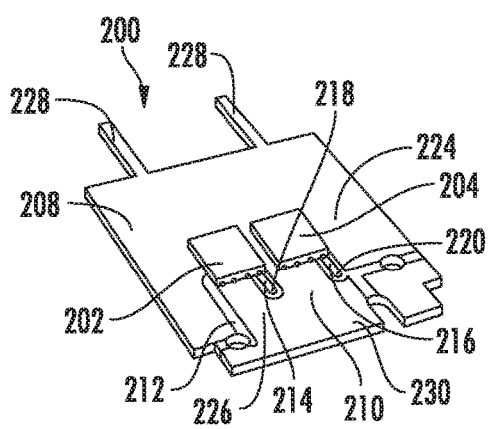
FIGS. 2A and 2B are top and bottom perspective views of an integrated circuit assembly according to another example embodiment of the present disclosure.
Figure 2B:
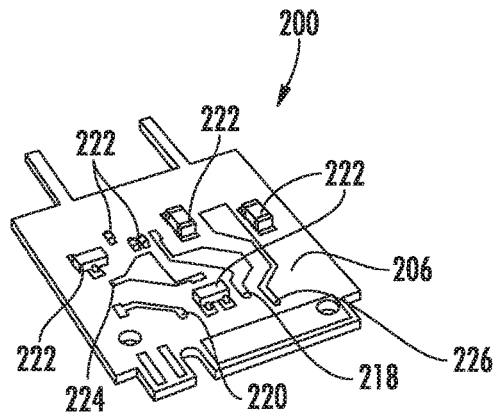

FIGS. 2A and 2B illustrate a circuit assembly 200 according to another example embodiment. The circuit assembly 200 includes two integrated circuits 202, 204 with leads directly connected to two electrically conductive sheets 208, 210 on a top side of the assembly (shown in FIG. 2A), and a circuit board 206 on a bottom side of the assembly (shown in FIG. 2B). This example assembly 200 can function as a busbar for high current applications, a heat sink to dissipate heat generated along the high current path(s), and a control circuit board for controlling one or more integrated circuits in the current path(s). Further, the ability to function as a heat sink may reduce or eliminate any need for an external heat sink (such as the heat sinks that are often coupled to busbars in the prior art).

The circuit assembly 200 includes the two electrically conductive sheets 208, 210 separated by a non-conductive material 212. Electrical traces 214, 216 are disposed on the non-conductive material 212. Each trace 214, 216 includes a conductive via 218, 220 formed in the non-conductive material 212, between the top side and the bottom side of the circuit assembly 200. The circuit board 206 includes multiple control components 222, which provide control signals to one or both integrated circuits 202, 204. Each conductive via 218, 220 provides the control signal from the circuit board 206 to a lead of each integrated circuit 202, 204 electrically connected to the electrical traces 214, 216, respectively. When a circuit assembly includes multiple integrated circuits, such as shown in FIG. 2, a circuit board may provide the same control signal to each integrated circuit, or provide different control signals to the integrated circuits such that, e.g., one integrated circuit may be "on" while the other integrated circuit is "off." In the example of FIG. 2, the control signals are provided from the bottom side (layer) of the assembly 200 to the top side (layer) of the assembly through the conductive vias.

As shown in FIG. 2B, the assembly 200 may include additional conductive vias 224, 226 for other purposes, such as coupling the circuit board to the voltages and/or currents present in one or both of the electrically conductive sheets.

As shown in FIG. 2A, the electrically conductive sheet 208 defines two input terminals 228 for coupling the circuit assembly 200 to a power source. Similarly, the electrically conductive sheet 210 defines an output terminal 230 for coupling the circuit assembly 200 to a load. As should be apparent, the number, shape and position of the input and output terminals may vary in any given implementation.

Figure 3:
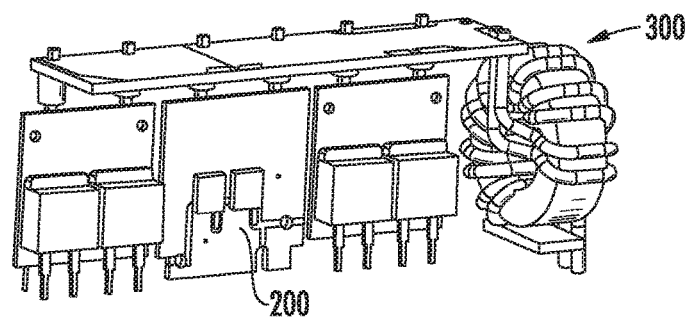
FIG. 3 is a perspective view of a power converter including the integrated circuit assembly of FIG. 2.

As shown in FIG. 3, the circuit assembly 200 may be included in a power converter 300. The power converter 300 includes receptacles for receiving the terminals 228, 230 of the circuit assembly 200. The power converter 300 may employ a forward converter or other suitable topology. Alternatively, the circuit assembly 200 of FIG. 2, and circuit assemblies according to other embodiments of this disclosure, may be employed in a wide variety of other devices and systems, in addition to power converters.

In the example of FIG. 2, the circuit board 206 is a double-sided board with a single insulation layer. Alternatively, circuit boards having inner conductive layers can also be used. One example of an integrated circuit assembly 400 employing such a circuit board is shown in FIG. 4. As shown, the assembly 400 includes a circuit board having multiple insulation layers 402 and multiple circuit layers 404 (including an inner insulation layer and an inner circuit layer).

One example method of making an integrated circuit assembly will now be described with reference to FIGS. 5-11. It should be understood, however, that integrated circuit assemblies, including those described above, can be formed by many other methods. Similarly, the example method described below can be used to make a wide variety of integrated circuit assemblies other than (or in addition to) the integrated circuit assemblies described above.

The example method of making an integrated circuit assembly includes positioning a non-conductive material in an opening defined by one or more electrically conductive sheets, forming an electrical trace on at least a portion of the non-conductive material, and soldering at least first and second leads of an integrated circuit directly to the electrically conductive sheet and the electrical trace, respectively. The method may further include, if necessary or desirably, coupling a circuit board to a bottom side of the electrically conductive plate, possibly with a control circuit for providing control signals to the integrated circuit lead connected to the electrical trace.

FIGS. 5A and 5B illustrate one example of an electrically conductive sheet 500 defining an opening 502 therein. As will be appreciated, the opening 502 can have any suitable size and shape, including non-circular and non-rectangular shapes. In the example of FIG. 5, the opening 502 is substantially L-shaped, and has an end that extends to a side edge of the electrically conductive sheet 500. The opening 502 can be formed by any suitable process including stamping, routing, cutting, drilling, etc. In some embodiments, the conductive sheet 500 is a solid copper sheet.

FIG. 6 illustrates the electrically conductive sheet 500 after a non-conductive material 504 is positioned in the opening 502. In the example of FIG. 6, the non-conductive material 504 fills the opening 502 to excess, such that some material 504 extends above a top edge of the opening 502. Alternatively, the non-conductive material 504 may be positioned in the opening 502 flush with the top edge (and bottom edge, if desired) of the opening.

FIG. 7 illustrates the conductive sheet 500 after the non-conductive material 504 is optionally planarized, so the non-conductive material 504 is flush with a top edge of the opening 502.

FIG. 8 illustrates the conductive sheet 500 of FIG. 7 with a circuit board 506 coupled to a bottom side of the conductive sheet 500. The circuit board 506 may be coupled to the conductive sheet 500 by, e.g., laminating one or more insulation layers of pre-impregnated composite fiber 520 and one or more circuit layers of foil 522 over each layer of composite fiber. Alternatively, the circuit board 506 may be separately formed and then coupled to the conductive sheet 500 using any suitable process.

The method may also include forming conductive vias in the assembly. For example, FIG. 9 shows the assembly of FIG. 8 after holes 508, 510 are formed in the electrically conductive sheet 500, the non-conductive material 504 and the circuit board 506 using any suitable process such as drilling. The method may further include plating (e.g., with copper) at least a portion of the exposed surfaces of the electrically conductive sheet 500 and the non-conductive material 504, including the holes 508, 510. The plating may be limited to a top side, bottom side, or a portion of one or more sides. FIG. 10 illustrates the assembly of FIG. 9 after the top side of the assembly and the holes 508, 510 are plated with an electrically conductive material. In the example of FIG. 10, the plating is directly over and in direct contact with the non-conductive material 504 in the holes 508, 510.

FIG. 11 illustrates the assembly of FIG. 10 after some of the plating 512 is removed (e.g., by etching and/or stripping) from the non-conductive material 504 to form an electrical trace 514 disposed on the non-conductive material 504. The electrical trace 514 is electrically isolated from the electrically conductive sheet 500. FIG. 11 also illustrates one or more traces 516 formed on the circuit board 506 by removing some of the plating 512 from the circuit board 506.

The method may also include removing a portion 518 (shown in FIG. 5A) of the conductive sheet to essentially divide the electrically conductive sheet 500 into two conductive sheets 500A, 500B that are electrically isolated from one another. This may be done after removing the plating 512, so portion 518 can provide support during the assembly process. Alternatively, portion 518 may be removed (including well before) removing the plating 512. As another alternative, two electrically conductive sheets can be provided at the outset of the assembly process (in lieu of the single conductive sheet 500). The two conductive sheets can be arranged to define an opening therebetween. The opening can then be filled with a non-conductive material and further processed as described above.

Referring to FIG. 11, the plated holes 508, 510 form conductive vias for providing electrical conductivity between the top and bottom sides of the electrically conductive sheets and/or non-conductive material. Specifically, hole 510 forms a conductive via between an electrical trace 514 disposed on the non-conductive material 504 on the top side of the circuit assembly and a trace 516 included in the circuit board 506 on the bottom side.

The method may further include soldering at least one lead of an integrated circuit directly to the electrically conductive sheet 500 (or 500A) and another lead of the integrated circuit to the electrical trace 514. A third lead of the integrated circuit may be soldered to the electrically conductive sheet 500B. Further, a control circuit may be mounted o the circuit board and electrically connected to one of the leads of the integrated circuit by a conductive via. In this manner, the control circuit on one side of the assembly may be used to control an integrated circuit on another side of the assembly.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

The invention claimed is:

1. An integrated circuit assembly comprising:
an integrated circuit;
a first electrically conductive sheet formed separately from the integrated circuit;
a second electrically conductive sheet electrically isolated from the first electrically conductive sheet and formed separately from the integrated circuit;
a non-conductive material disposed between the first and second electrically conductive sheets and formed separately from the integrated circuit, the non-conductive material separating and electrically isolating the first electrically conductive sheet from the second electrically conductive sheet;
an electrical trace disposed on the non-conductive material and electrically isolated from the first and second electrically conductive sheets, the electrical trace including a conductive via formed in at least the non-conductive material;
the integrated circuit having a top side and a bottom side, the integrated circuit positioned on a first side of the electrically conductive sheets and having at least one lead directly connected to the first electrically conductive sheet on the bottom side of the integrated circuit, at least one lead directly connected to the second electrically conductive sheet on the bottom side of the integrated circuit, and at least one lead electrically connected to the electrical trace on the bottom side of the integrated circuit;
a circuit board positioned on a second side of the electrically conductive sheets; and
at least one control circuit disposed on the circuit board and electrically connected to the conductive via for providing a control signal to the integrated circuit.

2. The circuit assembly of claim 1, wherein the integrated circuit includes a surface-mount power device, and wherein the control circuit is adapted to control the surface-mount power device to control current flow between the first electrically conductive sheet and the second electrically conductive sheet.

3. The circuit assembly of claim 2, wherein the first electrically conductive sheet defines at least one terminal for coupling the circuit assembly to a power source and the second electrically conductive sheet defines at least one terminal for coupling the circuit assembly to a load.

4. A power converter comprising the circuit assembly of claim 3.

5. The circuit assembly of claim 3, wherein the circuit board includes multiple insulated layers and multiple trace layers.

6. The circuit assembly of claim 3, wherein the first and second electrically conductive sheets each have a thickness of at least about 0.5 millimeter.

7. The integrated circuit assembly of claim 1, wherein the first and second electrically conductive sheets each include a copper core plated with an electrically conductive material.

8. The integrated circuit assembly of claim 1, wherein the non-conductive material includes a dielectric resin.

9. The integrated circuit assembly of claim 2, wherein the first and second electrically conductive sheets are adapted to radiate heat generated by current flow through the current path.

* * * * *